US006982427B2

(12) United States Patent
Kawasaki et al.

(10) Patent No.: US 6,982,427 B2
(45) Date of Patent: Jan. 3, 2006

(54) ELECTRON BEAM APPARATUS WITH ABERRATION CORRECTOR

(75) Inventors: Takeshi Kawasaki, Musashino (JP); Takaho Yoshida, Kodaira (JP); Yoichi Ose, Mito (JP); Hideo Todokoro, Hinode (JP)

(73) Assignee: Hitachi High Technologies Corporation, Tokyo (JP)

( * ) Notice: Subject to any disclaimer, the term of this patent is extended or adjusted under 35 U.S.C. 154(b) by 0 days.

(21) Appl. No.: 10/754,581

(22) Filed: Jan. 12, 2004

(65) Prior Publication Data

US 2004/0188635 A1 Sep. 30, 2004

(30) Foreign Application Priority Data

Mar. 31, 2003 (JP) ............................. 2003-094285

(51) Int. Cl.
*G01K 1/08* (2006.01)
*G21K 1/08* (2006.01)

(52) U.S. Cl. ..................... 250/396 R; 250/396 ML; 250/310; 250/311

(58) Field of Classification Search ........ 250/396 ML, 250/396 R, 306, 310, 309, 311
See application file for complete search history.

(56) References Cited

U.S. PATENT DOCUMENTS 3,952,198 A * 4/1976 Harada et al. ....... 250/396 ML
2003/0098415 A1* 5/2003 Matsuya et al. ............ 250/306

FOREIGN PATENT DOCUMENTS

JP 2000-195453 12/1998

OTHER PUBLICATIONS

J. Zach, "Design of a High-Resolution Low-Voltage Scanning Electron Microscope", Optik vol. 83, No. 1 (1989), pp. 30-40.
Joachim Zach and Maximilian Haider, "Aberration Correction in a Low Voltage SEM by a Multipole Corrector", Nuclear Instruments and Methods in Physics Research , A 363 (1995), pp. 316-325.

* cited by examiner

*Primary Examiner*—John R. Lee
*Assistant Examiner*—Kalimah Fernandez
(74) *Attorney, Agent, or Firm*—Reed Smith LLP; Stanley P. Fisher, Esq.; Juan Carlos A. Marquez, Esq.

(57) ABSTRACT

An electron beam apparatus with an aberration corrector using multipole lenses is provided. The electron beam apparatus has a scan mode for enabling the operation of the aberration corrector and a scan mode for disabling the operation of the aberration corrector and the operation of each of the aberration corrector, a condenser lens, and the like is controlled such that the object point of an objective lens does not change in either of the scan modes. If a comparison is made between the secondary electron images of a specimen in the two modes, the image scaling factor and the focus remain unchanged and evaluation and adjustment can be performed by distinctly recognizing only the effect of the aberration corrector. This reduces the time required to adjust an optical axis which has been long due to an axial alignment defect inherent in the aberration corrector and an axial alignment defect in a part other than the aberration corrector which are indistinguishably intermingled with each other.

8 Claims, 4 Drawing Sheets

ELECTRON BEAM APPARATUS WITH ABERRATION CORRECTOR

FIELD OF THE INVENTION

The present invention relates to a technology for minimizing a beam spot in an electron beam apparatus and, more particularly, to a scanning electron microscope, a critical dimension measurement SEM (CD-SEM), an electron beam lithography system, and the like.

BACKGROUND OF THE INVENTION

As semiconductor device patterns have been increasingly miniaturized in recent years, an apparatus for measuring the dimensions of the device patterns with high accuracy, such as a critical dimension measurement SEM, has been requested to achieve a resolution of about 3 to 1 nm by using an electron beam with an acceleration voltage of 1 kV or less for the prevention of specimen destruction. To satisfy the request, it is necessary to converge the electron beam into a spot with a diameter not more than a desired resolution on a specimen surface. With such a low acceleration voltage, chromatic aberration in an objective lens presents a first problem. To reduce the chromatic aberration, various attempts have already been made by sophisticating the design of the objective lens.

In the 1990s, a retarding technology was introduced which increases an acceleration voltage for electrons by the magnitude of Vr to allow the passage of the electrons through the objective lens with a higher energy, while decelerating the electrons with the application of a voltage −Vr to a specimen to keep the energy of an electron beam low when it is incident on the specimen. The technology allows a reduction in chromatic aberration at the rate shown in Expression (1) where $V_0$ is an electron acceleration voltage at an electron gun portion.

[Numerical Expression 1]

$$\sqrt{\frac{V_0}{V_0 + V_r}} \quad (1)$$

If Vr is excessively large, however, the specimen is destroyed by an electric field so that the magnitude of Vr which can be applied is limited. The chromatic aberration is also reduced accordingly if an electron source which emits an energy with a small width is used. At present, a field emission electron gun (with an emitted-electron energy width of about 0.3 eV), a Schottky field emission electron gun (with about 0.6 eV), and the like are used and an electron source having a smaller emitted-electron energy width and excellent stability is still in the search stage.

Since such a new electron source has not been commercialized yet, the reduction of the chromatic aberration in accordance with the foregoing methods is currently approaching the limit.

Of various approaches made to eliminate the limit, two have drawn attention, which are the use of a monochrometer and the reduction of the chromatic aberration using an aberration corrector. In relation to the approach using the aberration corrector, a technology which allows the compensation of the aberration in an objective lens by composing an aberration corrector from a combination of multipole lenses was proposed by Scherzer in the year 1947. In the 1970s, a specific structure had already been disclosed in Non-Patent Document 1 or Non-Patent Document 2. Recently, the technology has been experimentally verified by using a quadrupole/octupole aberration corrector of electromagnetic field type (Non-Patent Document 3).

An outline of the operation of this type of aberration corrector will be described with reference to FIG. 4. An aberration corrector 10 is composed of a multipole lens 11, an electromagnetic multipole lens 12, an electromagnetic multipole lens 13, and a multipole lens 14 to generate quadrupole fields and octupole fields in superimposed relation. In the aberration corrector 10, the quadrupole fields cause a converging effect and a diverging effect in respective two directions (the x-axis and the y-axis) perpendicular to an optical axis (the z-axis), which separate paraxial trajectories. In FIG. 4, the trajectories of electron beams are schematically shown by the fine lines. The first-stage multipole lens 11 causes the electron beams emitted from a crossover 41 to have trajectories in the x-direction (the x-trajectories each having one arrow in the drawing) diverged and trajectories in the y-direction (the y-trajectories each having two arrows in the drawing) converged, which are separated from each other. A trajectory in an arbitrary direction can be considered as a linear combination of these x- and y-trajectories. The second-stage electromagnetic multipole lens 12 is capable of generating a quadrupole electric field and a quadrupole magnetic field that has been 45° rotated from the quadrupole electric field relative to the optical axis in an x-y plane and compositely applying the electric field and the magnetic field in the x-y plane. The first-stage multipole lens 11 is excited such that the y-trajectories cross in the vicinity of the center of the electromagnetic multipole lens 12. At this time, the x-trajectories are apart from each other at a maximum distance to form a line image 42 extending in the x-direction at the center of the electromagnetic multipole lens 12. The excitation of the quadrupole of the electromagnetic multipole lens 12 has been adjusted such that the x-trajectories cross in the vicinity of the center of the third-stage electromagnetic multipole lens 13. At this time, a line image 43 presents a linear configuration extending in the y-direction. The x-trajectories and the y-trajectories separated past the fourth multipole lens 14 join at a crossover 44. The aberration corrector 10 is operated such that the crossover 41 is stigmatically formed into an image at the crossover 44.

At this time, the electromagnetic multipole lens 12 can be excited in the aberration corrector 10 by varying the ratio among the respective intensities of the quadruple fields including the electric and magnetic fields under the constraint that a resulting-force exerted on an incident electron with an energy serving as a reference is not changed. In this case, an electron with an energy shifted from the reference is different in speed from the electron with the reference energy so that the exerted force changes if the ratio among the respective intensities of the electric and magnetic fields changes and the trajectories are displaced. The displacement is large in the x-direction apart at a distance from the optical axis and the trajectories are hardly affected in the y-direction extending toward the centers of the multipole fields. When the electron passes through the electromagnetic multipole lens 13, the x- and y-directions in the foregoing relation are reversed. In other words, only electrons with incidence energies shifted independently in the x- and y-directions can have trajectories changed by changing the ratio among the respective intensities of the quadrupole fields including the electric and magnetic fields in the electromagnetic multipole lenses 12 and 13.

By using this, the respective trajectories of an electron with a higher energy and an electron with a lower energy are preliminarily shifted outwardly and inwardly, each by an amount which allows the compensation of the chromatic aberration in the subsequently disposed objective lens, whereby the compensation of the chromatic aberration is performed. By generating octupole fields by using the multipole lenses 11 to 14 in addition to the quadrupole fields, it is also possible to compensate for the spherical aberration as disclosed in the articles 3 and 7 of Non-Patent Document 3.

In these well-known examples, an embodiment which uses a dodecupole for superimposing the quadrupole fields and the octupole fields is shown. In these well-known examples, an electro-optical system is constructed with a view to reducing even high-order aberration occurring inherently in the aberration corrector. However, since extremely small probes should be formed, total axial alignment in an entire electron beam apparatus is difficult when the aberration corrector is incorporated into the apparatus.

[Patent Document 1] Japanese Unexamined Patent Publication No. 2000-195453

[Non-Patent Document 1] Optik 33 (1971), pages 1–24

[Non-Patent Document 2] Optik 83 (1989), pages 30 to 40

[Non-Patent Document 3] Nuclear Instruments and Methods in Physics Research, A 363 (1995), pages 316 to 325

SUMMARY OF THE INVENTION

In the case of introducing such an aberration corrector into an electron beam apparatus, it is intricate and time-consuming to adjust the excitation and axial misalignment of each of the quadrupoles and octupoles in four stages in the aberration corrector and simultaneously align even the electro-optical axes of the other components of the apparatus. The reason for this is that, even when the secondary electron image of the specimen is observed, an axial alignment defect inherent in the aberration corrector and an axial alignment defect in the component other than the aberration corrector are intermingled indistinguishably and therefore the respective causes thereof cannot be tracked down individually.

The present invention provides an electron beam apparatus with an aberration corrector which allows easy recognition of the effect of aberration correction, achieves a reduction in adjustment procedures therefor, and features enhanced ease of use.

In the electron beam apparatus with the aberration corrector according to the present invention, a computer for controlling each of lenses and the aberration corrector provided in the electron beam apparatus has a scan mode for enabling the operation of the aberration corrector and a scan mode for disabling the operation of the aberration corrector and controls the aberration corrector such that the object point of the objective lens does not change in either of the two modes. Alternatively, the computer controls the aberration corrector such that the object point of the objective lens does not change in either of the two modes by associating the magnetization of a condenser lens with the operation of the aberration corrector. To enable associated operation of the lenses, a deflector, the aberration corrector, and the like, a system for integrally controlling the power sources of the lenses, the deflector, the aberration corrector, and the like by using the computer is constructed.

Such a construction allows normal adjustment procedures required for beam convergence such as the alignment of an axis of incidence to the objective lens, focusing, and astigmatism correction to be generally performed in the scan mode for disabling the operation of the aberration corrector. Switching is performed continuously to the scan mode for enabling the operation of the aberration corrector. Since the object point of the objective lens is not moved in this mode, the image scaling factor and the focus remain unchanged. As a result, only an effect exerted by the aberration corrector on the electron beam can be evaluated from changes caused in a secondary electron image and in a written pattern by this procedure. In short, an increased probe diameter and deformation caused by various aberrations at this stage can be distinguished as those resulting from incomplete adjustment of the aberration corrector. Then, the excitation of each of the multipoles of the aberration corrector is finely adjusted individually such that the chromatic aberration and spherical aberration in the objective lens are eventually compensated for and a minimum probe diameter and an optimum resolution are obtainable. By independently performing the adjustment of the aberration corrector of the adjustment of the axial alignment of the objective lens other than the adjustment of the aberration corrector, the axial alignment process is simplified and the procedures for adjusting the entire apparatus are reduced.

DESCRIPTION OF THE PREFERRED EMBODIMENTS

Figure 1:
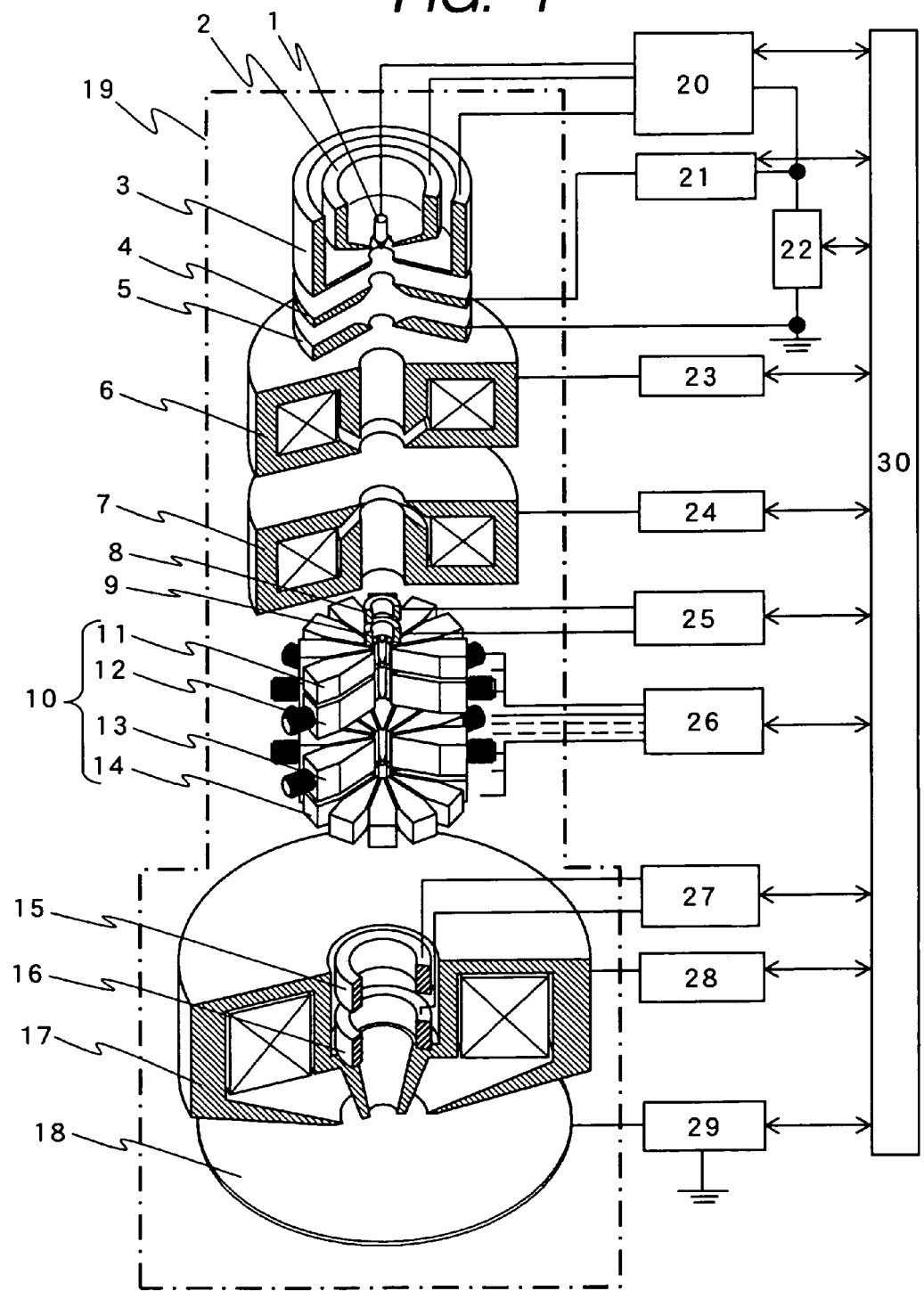
FIG. 1 is a schematic representation of an electron beam apparatus with an aberration correction means.

FIG. 1 schematically shows a structure of an example of an electron beam apparatus with an aberration corrector to which the present invention is applied. A Schottky emitter 1 is an electron source composed of monocrystalline tungsten containing oxygen, zirconium, and the like diffused therein and using a Schottky effect. A suppressor electrode 2 and an extraction electrode 3 are provided in the vicinity of the Schottky emitter 1. By heating the Schottky emitter 1 and applying a voltage of about +2 kV between the Schottky emitter 1 and the extraction electrode 3, Schottky electrons can be emitted from the Schottky emitter 1. A negative voltage is applied to the suppressor electrode 2 to suppress electrons emitted from the portion of the Schottky emitter 1 other than the tip portion thereof. The electrons that have come out of the hole of the extraction electrode 3 are accelerated and converged by an electrostatic lens formed of a first anode 4 and a second anode 5. Subsequently, an electron beam has a diameter limited by a first condenser lens 6 and a condenser aperture (not shown) and passes through a second condenser lens 7, an upper deflection coil 8, and a lower deflection coil 9 to be incident at a desired angle on an aberration corrector 10. In the aberration corrector 10, a multipole lens 11, an electromagnetic multipole lens 12, an electromagnetic multipole lens 13, and a multipole lens 14 are disposed by using an optical axis as a common axis. In the case where chromatic aberration is to be corrected, a quadrupole electric field or a quadrupole magnetic field is formed in a plane perpendicular to the optical axis by using the multipole lenses 11 and 14, while a quadrupole electric field and a quadrupole magnetic field that has been 45° rotated from the preceding quadrupole electric field relative to the optical axis in an x-y plane are formed by using the electromagnetic multipole lenses 12 and 13. These fields are formed by using a 4-pole electrode, an 8-pole electrode, or a 12-pole electrode (which may serve also as a magnetic pole). In the case where not only the chromatic aberration but also spherical aberration are to be corrected, octupole fields are formed in addition to the quadrupole fields by using the foregoing electrode and superimposed on the quadrupole fields. In this case, the multipole lenses require an octupole and a dodecupole. The electron beam imparted with the chromatic aberration and the spherical aberration to be compensated for in the objective lens 17 by the aberration corrector 10 passes through an upper scanning deflector 15 and a lower scanning deflector 16 to be converged by the objective lens 17 on a specimen 18 and used for scanning.

In the case where the electron beam apparatus is used as a scanning electron microscope, a mechanism for detecting a secondary electron and a reflected electron and forming an image thereof is attached thereto, though it is not depicted herein. As the objective lens 17, a rotationally symmetric lens of magnetic field type, electric field type, or electromagnetic field type is used. There are cases where a voltage is applied from a retarding voltage source 29 to the specimen 18 to decelerate the electrons between the specimen 18 and the objective lens 17 for the prevention of the destruction of the specimen by the electron beam and the reduction of the aberration. Each of the components of the electron beam apparatus described above is accommodated in a vacuum chamber 19 and connected electrically to each of outside-vacuum current and voltage sources (20 to 29) via a connector. A method for supporting each of the components in the vacuum chamber 19 is not illustrated for the sake of simplicity. An electron bean can be generated and controlled for scanning or the like by controlling these power sources via a computer 30, Embodiment 1

Figure 2:
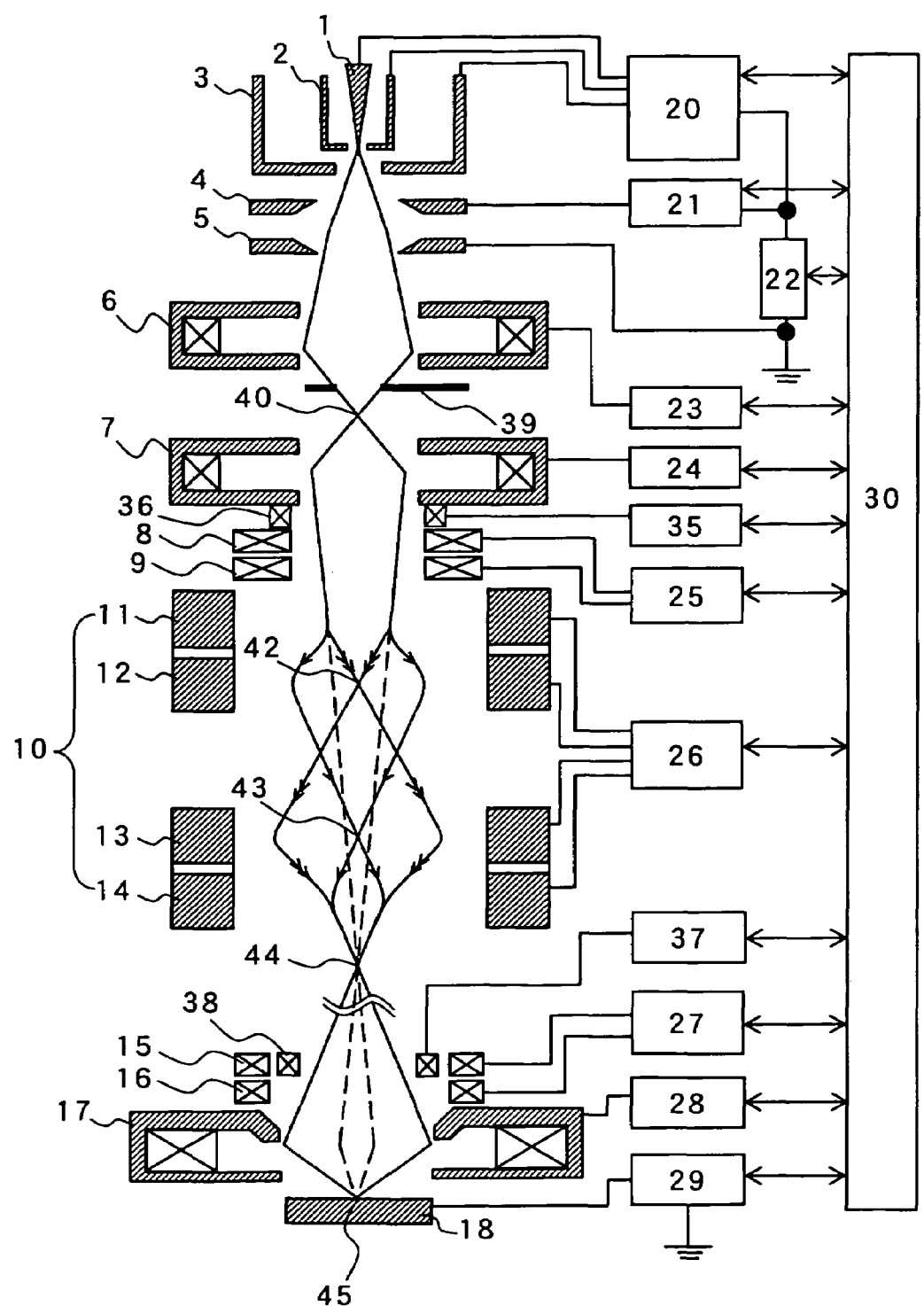
FIG. 2 is a schematic vertical view showing the electron beam path and the composition of an electron beam apparatus of an embodiment according to the present invention.

FIG. 2 shows a first embodiment of the present invention. Based on the structure of the electron beam apparatus with the aberration corrector shown in FIG. 1, a control operation according to Embodiment 1 will be described by focusing attention on the trajectories of electron beams.

The electrons emitted from the Schottky emitter 1 initially follow the trajectories indicated by the solid lines, along which they are accelerated between the first and second anodes 4 and 5 and converged by the first condenser lens 6, a condenser aperture 39, and the second condenser lens 7 to reach the aberration corrector 10 (the two condenser lenses need not necessarily be provided). In the scan mode (OFF mode) for disabling the operation of the aberration corrector 10, x- and y-trajectories are not separated from each other and move straight forward in the aberration corrector 10 along the trajectories indicated by the broken lines in the drawing to form a crossover at the position denoted by 44, which serves as the object point of the objective lens 17.

To achieve the maximum resolution, an objective aligner 38 is adjusted such that the electron beams pass through the center of a current in the objective lens 17. Although this technique has been established, the electron beams are incident obliquely on the objective lens 17 in a strict sense of the term. Astigmatism and curvature of field aberration occurring at this stage can be corrected by using a stigmator 36 so that distortion does not cause an image blur. It can be considered that axial alignment which totally minimizes comatic aberration and lateral chromatic aberration has been performed. Although these aberrations resulting from the oblique incidence on the objective lens 17 can be eliminated in accordance with a method as disclosed in Patent Document 1, spherical aberration and axial chromatic aberration remain unremoved till the end.

Figure 4:
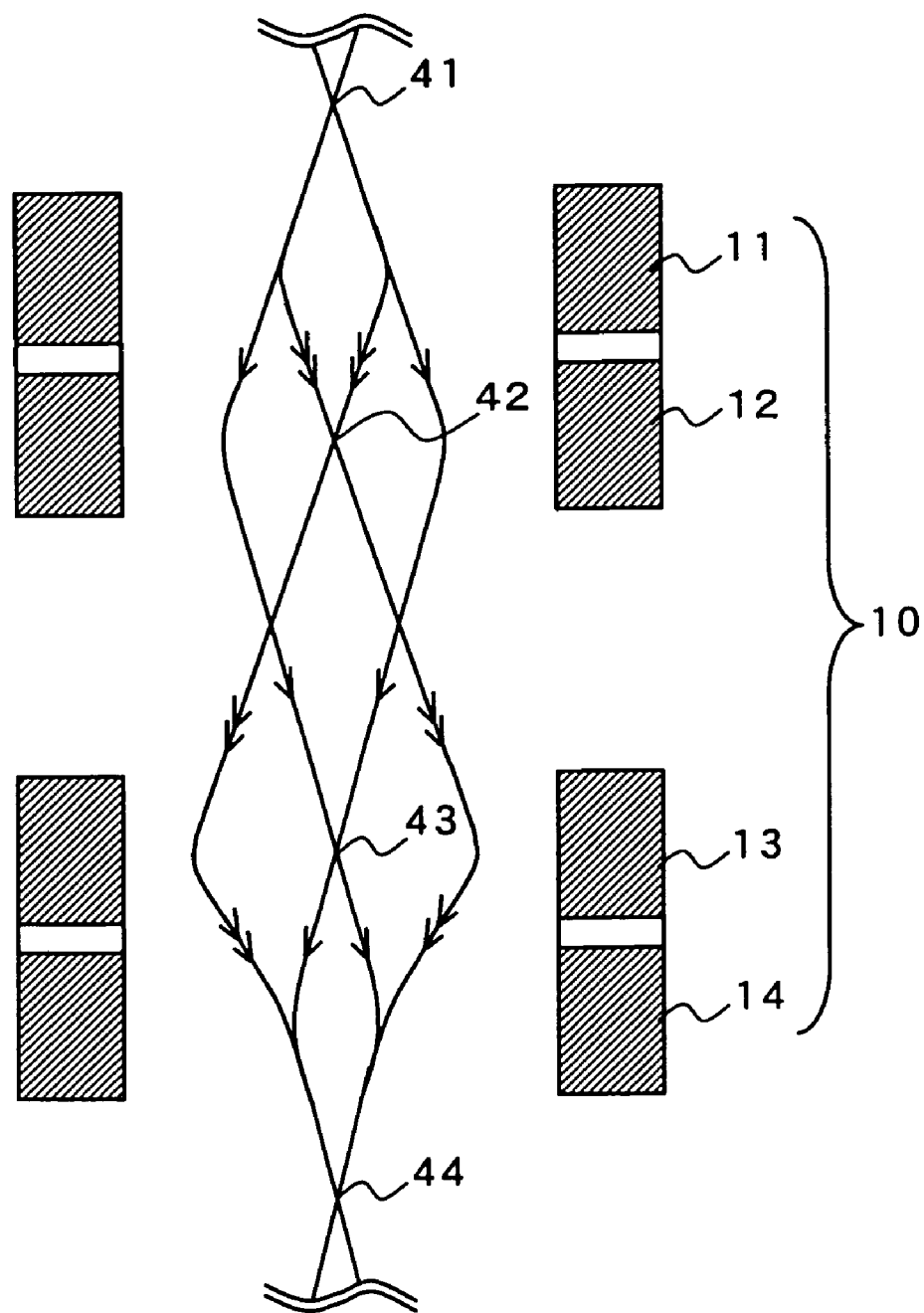
FIG. 4 is a schematic representation showing the composition of an aberration correction means and electron trajectories.

After the axial alignment is completed in the OFF mode, the aberration corrector 10 is operated in that state (ON mode). In this state, the electrons converged by the second condenser lens 7 and incident on the aberration corrector 10 are divided in the x- and y-directions in the aberration corrector 10, as described with reference to FIG. 4, and travel along the paraxial trajectories indicated by the solid lines in FIG. 2. At this time, the respective intensities of the multipole lenses have been set such that a crossover is formed at the position denoted by 44 in the aberration corrector 10. To actually form the crossover 44, the respective intensities of the quadrupole fields in the individual stage of the aberration corrector 10 can be determined by numerical calculation based on the following concept. For the sake of simplicity, it is assumed herein that each of the distance between the multipole lens 11 and the electromagnetic multipole lens 12 and the distance between the electromagnetic multipole lens 13 and the multipole lens 14 is zero, high-order fields are not considered by forming each of the electrodes and magnetic poles of the multipole lenses into a hyperbolic configuration, and the distance between the multipoles is actually finite, though numerical expressions for analytical calculation are shown explicitly. The configurations of the electrodes and the magnetic poles are inputted to a calculator and the fields are determined by. simulation using the calculator based on the concept shown below.

Equations for determining the paraxial trajectories of the quadrupole lenses are represented as in Expressions (2) and (3) by assuming the z-direction as the direction of the optical axis:

[Numerical Expression 2]

$$X''(z) = -\beta^2 k(z) X(z) \quad (2)$$

$$Y''(z) = \beta^2 k(z) Y(z) \quad (3)$$

where $\beta^2$ is represented by the expression (4):

[Numerical Expression 3]

$$\beta^2 = \left( \frac{\phi_2}{\sqrt{\phi}} - \frac{\phi_2}{\phi} \right) \quad (4)$$

where k(z) represents the field distribution in the z-direction, $\phi_2$ represents the intensity of a quadrupole magnetic field, $\phi_2$ represents the intensity of a quadrupole electric field, and $\phi$ represents a potential on the axis, which is determined by a voltage applied to the electrode and a coil current. It is appropriate to determine $\beta_i$ (i=1 to 4) for each of the stages. In an actual process, a dimensionless parameter $\theta_i = \beta_i L$ is determined, where L represents the thickness of each of the electrodes in the direction of the z-axis, $\theta_1$ corresponds to the multipole lens 11, $\theta_2$ corresponds to the electromagnetic multipole lens 12, $\theta_3$ corresponds to the electromagnetic multipole lens 13, and $\theta_4$ corresponds to the multipole lens 14. It is assumed herein that the respective positions of the second condenser lens 7, the objective lens 17, the aberration corrector 10, and the crossover 44 have been given in advance.

Under the foregoing conditions, four variables ($\theta_1$ to $\theta_4$) are calculated in accordance with the following numerical expressions to determine the respective intensities of the quadrupoles in the individual stages.

1. The passage of each of the y-trajectories through the center of the second-stage electromagnetic multipole lens 12, which is a condition for enabling aberration correction as described above with reference to FIG. 4, allows a condition represented by Expression (5) to be obtained.

[Numerical Expression 4]

$$\frac{1}{\theta_4\theta_3\theta_2}\left[L\theta_3\sinh\left(\frac{\theta_2}{2}\right)\{\theta_4\cos\theta_3(\cosh\theta_4 + p\theta_4\sinh\theta_4) - \theta_3\sin\theta_3(\sinh\theta_4 + p\theta_4\cosh\theta_4)\} + L\theta_2\cosh\left(\frac{\theta_2}{2}\right)\{\theta_4\sin\theta_3(\cosh\theta_4 + p\theta_4\sinh\theta_4) + \theta_3\cos\theta_3(\sinh\theta_4 + (a+p)\theta_4\cosh\theta_4 + ap\theta_4^2\sinh\theta_4) - a\theta_2^2\sin\theta_3(\sinh\theta_4 + \theta_4 p\cosh\theta_4)\}\right] \quad (5)$$

where a×L is the distance between the electromagnetic multipole lens 12 and the electromagnetic multipole lens 13 and p×L is the distance between a plane extending along the lower end surface of the multipole lens 14, which is in perpendicular relation to the optical axis., and the crossover 44.

2. Since a conical converged beam is incident on the aberration corrector 10, conditions represented by Expressions (6) and (7) can be obtainable from the relationship between the coordinates of the x- and y-trajectories on the upper end surface of the aberration corrector 10 and the gradients:

[Numerical Expression 5]

$$\frac{1}{\theta_2\theta_3\theta_4}[\theta_2\{\theta_3(\cos\theta_2\cosh\theta_1(\theta_4\cosh\theta_3(\cos\theta_4 - p\theta_4\sin\theta_4) + \theta_3\sinh\theta_3(\sin\theta_4 + p\theta_4\cos\theta_4)) + \theta_3\cos\theta_1\cosh\theta_2(-\theta_4\cos\theta_3(\cosh\theta_4 + p\theta_4\sinh\theta_4) + \theta_3\sin\theta_3(\sinh\theta_4 + p\theta_4\cosh\theta_4))) + (-\theta_4\cos\theta_4\cosh\theta_1\sin\theta_2(\sinh\theta_3 + (a+p)\theta_3\cosh\theta_3 + ap\theta_3^2\sinh\theta_3) + \cos\theta_1\sinh\theta_2(-\theta_4\sin\theta_3(\cosh\theta_4 + p\theta_4\sinh\theta_4) - \theta_3\cos\theta_3(\sinh\theta_4 + (a+p)\theta_4\cosh\theta_4 + ap\theta_4^2\sinh\theta_4) + a\theta_3^2\sin\theta_3(\sinh\theta_4 + p\theta_4\cosh\theta_4)) + \cosh\theta_1\sin\theta_4\sin\theta_2(p\theta_4^2(\sinh\theta_3 + a\theta_3\cosh\theta_3) - \theta_3(\cosh\theta_3 + a\theta_3\sinh\theta_3)))\theta_2\} + \{\theta_3(\sin\theta_2\sinh\theta_1(\theta_4\cosh\theta_3(\cos\theta_4 - p\theta_4\sin\theta_4) + \theta_3\sinh\theta_3(\sin\theta_4 + p\theta_4\cos\theta_4)) + \theta_3\sin\theta_1\sinh\theta_2(\theta_4\cos\theta_3(\cosh\theta_4 + p\theta_4\sinh\theta_4) - \sin\theta_3(\sinh\theta_4 + p\theta_4\cosh\theta_4))) + (\theta_4\cos\theta_4\cos\theta_2\sinh\theta_1(\sinh\theta_3 + (a+p)\theta_3\cosh\theta_3 + ap\theta_3^2\sinh\theta_3) + \cosh\theta_2\sin\theta_1(\theta_4\sin\theta_3(\cosh\theta_4 + p\theta_4\sinh\theta_4) +$$

-continued $$\theta_3\cos\theta_3(\sinh\theta_4 + (a+p)\theta_4\cosh\theta_4 + ap\theta_4^2\sinh\theta_4) - a\theta_3^2\sin\theta_3(\sinh\theta_4 + p\theta_4\cosh\theta_4)) + \cos\theta_2\sin\theta_4\sinh\theta_1(-p\theta_4^2(\sinh\theta_3 + a\theta_3\cosh\theta_3) + \theta_3(\cosh\theta_3 + a\theta_3\sinh\theta_3)))\theta_2\}\theta_1] = 0$$

[Numerical Expression 6]

$$\frac{1}{\theta_1\theta_2\theta_3\theta_4}[L\theta_2\{\theta_3(\cos\theta_2\sinh\theta_1(\theta_4\cosh\theta_3(\cos\theta_4 - p\theta_4\sin\theta_4) + \theta_3\sinh\theta_3(\sin\theta_4 + p\theta_4\cos\theta_4)) + \cosh\theta_2\sin\theta_1(-\theta_4\cos\theta_3(\cosh\theta_4 + p\theta_4\sinh\theta_4) + \theta_3\sin\theta_3(\sinh\theta_4 + p\theta_4\cosh\theta_4))) + \theta_2(-\theta_4\cos\theta_4\sin\theta_2\sinh\theta_1(\sinh\theta_3 + (a+p)\theta_3\cosh\theta_3 + ap\theta_3^2\sinh\theta_3) + \sin\theta_1\sinh\theta_2(-\theta_4\sin\theta_3(\cosh\theta_4 + p\theta_4\sinh\theta_4) - \theta_3\cos\theta_3(\sinh\theta_4 + (a+p)\theta_4\cosh\theta_4 + ap\theta_4^2\sinh\theta_4) + a\theta_3^2\sin\theta_3(\sinh\theta_4 + p\theta_4\cosh\theta_4)) + \sin\theta_4\sin\theta_2\sinh\theta_1(p\theta_4^2(\sinh\theta_3 + a\theta_3\cosh\theta_3) - \theta_3(\cosh\theta_3 + a\theta_3\sinh\theta_3)))\} + L\theta_1\{\theta_3(\cosh\theta_1\sin\theta_2(\theta_4\cosh\theta_3(\cos\theta_4 - p\theta_4\sin\theta_4) + \theta_3\sinh\theta_3(\sin\theta_4 + p\theta_4\cos\theta_4)) + \cos\theta_1\sinh\theta_2(-\theta_4\cos\theta_3(\cosh\theta_4 + p\theta_4\sinh\theta_4) + \theta_3\sin\theta_3(\sinh\theta_4 + p\theta_4\cosh\theta_4))) + \theta_2(\theta_4\cos\theta_4\cos\theta_2\cosh\theta_1(\sinh\theta_3 + (a+p)\theta_3\cosh\theta_3 + ap\theta_3^2\sinh\theta_3) + \cos\theta_1\cosh\theta_2(-\theta_4\sin\theta_3(\cosh\theta_4 + p\theta_4\sinh\theta_4) - \theta_3\cos\theta_3(\sinh\theta_4 + (a+p)\theta_4\cosh\theta_4 + ap\theta_4^2\sinh\theta_4) + a\theta_3^2\sin\theta_3(\sinh\theta_4 + p\theta_4\cosh\theta_4)) + \cos\theta_2\cosh\theta_1\sin\theta_4(-p\theta_4^2(\sinh\theta_3 + a\theta_3\cosh\theta_3) + \theta_3(\cosh\theta_3 + a\theta_3\sinh\theta_3)))\}] = 0 \quad (7)$$

3. The position of the crossover 44 is fixed irrespective of the ON/OFF modes of the aberration corrector 10 and Expression (8) is obtainable from a condition for stigmatic image formation under which and the x-trajectories and the y-trajectories including the gradients thereof match at that point:

[Numerical Expression 7]

$$\frac{1}{\theta_1\theta_2\theta_3\theta_4}[L\{\theta_2^2\sinh\theta_2(-\theta_4\sin\theta_3(\cosh\theta_4 + p\theta_4\sinh\theta_4) - \theta_3\cos\theta_3(\sinh\theta_4 + (a+p)\theta_4\cosh_4 + ap\theta_4^2\sinh\theta_4) + a\theta_3^2\sin\theta_3(\sinh\theta_4 + p\theta_4\cosh\theta_4))(-\sin\theta_1 + (4+a+p)\theta_1\cos\theta_1) + \theta_3\theta_1\sinh\theta_2(\theta_4\cos\theta_3(\cosh\theta_4 + p\theta_4\sinh\theta_4) - \theta_3\sin\theta_3(\sinh\theta_4 + p\theta_4\cosh\theta_4))(\cos\theta_1 + (4+a+p)\theta_1\sin\theta_1) + (\theta_2\cosh\theta_2(\theta_3\sin\theta_1(\theta_4\cos\theta_3(\cosh\theta_4 + p\theta_4\sinh\theta_4) - \theta_3\sin\theta_3(\sinh\theta_4 + p\theta_4\cosh\theta_4)) + \theta_1\cos\theta_1(p\theta_4^2\sinh\theta_4(\sin\theta_3 - (4+p)\theta_3\cos\theta_3) + \theta_3\sinh\theta_4(\cos\theta_3 + (4+p)\theta_3\sin\theta_3) +$$ \quad (8)

-continued $$\theta_4 \cosh\theta_4(\sin\theta_3 - 4\theta_3\cos\theta_3 + p(4+p)\theta_3^2\sin\theta_3)) +$$

$$(4 + a + p)\sin\theta_1(\theta_4\sin\theta_3(\cosh\theta_4 + p\theta_4\sinh\theta_4) +$$

$$\theta_3\cos\theta_3(\sinh\theta_4 + (a+p)\theta_4\cosh\theta_4 + ap\theta_4^2\sinh\theta_4) -$$

$$a\theta_3^2\sin\theta_3(\sin\theta_4 + p\theta_4\cosh\theta_4))\theta_1^2))\}] = 0$$

4. From the foregoing four expressions, $\theta_1$ to $\theta_4$ are numerically determined and the paraxial trajectories are determined. Under these conditions, the position at which the line image 43 is formed is not strictly the center of the electromagnetic multipole 13. The presence of the solutions is not self-evident. There are cases where $\theta_1$ to $\theta_4$ which simultaneously satisfy the foregoing four expressions are not present depending on the values of a and p. This indicates that the respective crossover positions of the x-trajectories and the y-trajectories do not match, stigmatic image formation cannot be performed at the crossover 44, and aberration correction cannot be performed. In that case, measures are taken by considering the design of the apparatus such that the solutions of $\theta_1$ to $\theta_4$ are present in such a manner as to change the value of p by shifting the positional setting of the crossover 44 or change the distance between the electromagnetic multipole lenses 12 and 13 in the aberration corrector.

5. Amounts of blur at the crossover 44 resulting from the chromatic aberration are calculated for incident electron beams with different energies by varying the ratio among the respective intensities of the quadrupole electric fields and the quadrupole magnetic fields without changing the respective magnitudes of $\theta_2$, $\theta_3$ determined in the foregoing procedure 4, and the ratio among the respective intensities of the electric fields and the magnetic fields is determined such that the chromatic aberration (already known) in the objective lens 17 is compensated for.

6. In the case of correcting even the spherical aberration, spherical aberration in the aberration corrector 10 is calculated under the foregoing conditions and correction is performed by superimposing the octupole fields in each of the multipole lenses 11 to 14 such that the spherical aberration (already known) in the objective lens 17 is compensated for. At this time, the paraxial trajectories remain unchanged since $\theta_1$ to $\theta_4$ are unchanged.

By the foregoing procedures, ON-mode operating conditions (excitation conditions for the individual quadrupole and octupole fields) for the aberration corrector 10 can be determined, while the object point of an objective lens 17 as shown in FIG. 2 is fixed.

If the resolution obtained in this state is not more excellent than in the OFF mode, it is attributable to insufficient adjustment of the aberration corrector 10 so that the spherical and chromatic aberrations remaining in the objective lens 17 are corrected by adjusting the axial alignment of the aberration corrector 10 in accordance with, e.g., the method disclosed in the article 3 and the page 319 of Non-Patent Document 3 described above, whereby a totally optimal resolution is obtainable.

Embodiment 2

Figure 3:
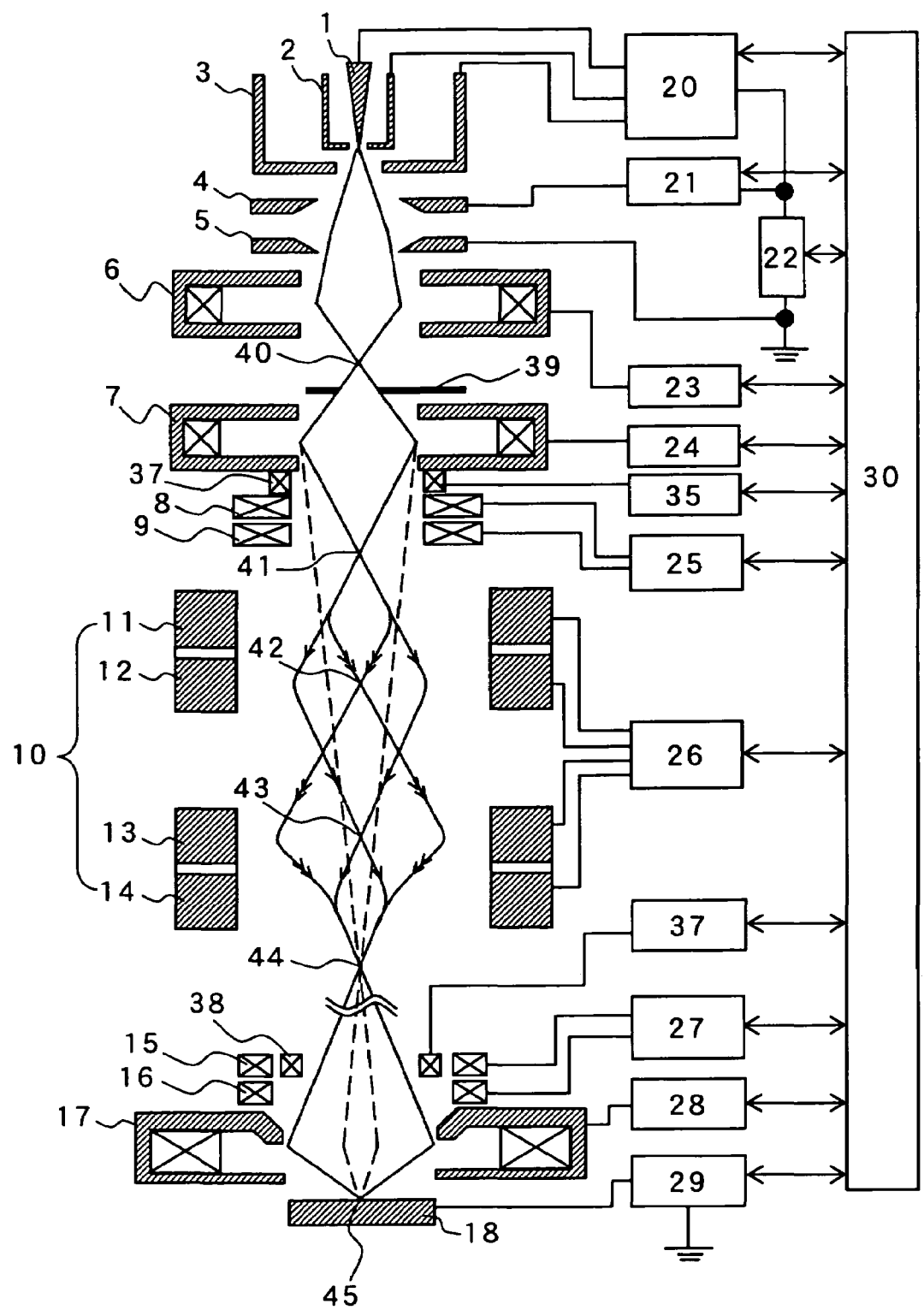
FIG. 3 is a schematic vertical view showing electron trajectories and the composition of an electron beam apparatus of another embodiment according to the present invention.

FIG. 3 shows Embodiment 2 of the present invention. In this example, when the aberration corrector 10 is in the OFF mode, the condenser lens 7 is used with weak magnetization (indicated by the broken lines) in the same manner as in Embodiment 1 and the crossover 44 serving as the object point of the objective lens 17 is formed posterior to the aberration corrector 10. By using the computer 30, switching between the strong/weak magnetizations for the second condenser lens 7 is performed in association with switching between the ON/OFF modes of the aberration corrector 10 so that the second condenser lens 7 is used with strong magnetization in the ON mode and the crossover 41 (indicated by the solid lines) is formed anterior to the aberration corrector 10. The crossover 41 is caused to form a stigmatic image at the position of the crossover 44 by using the aberration corrector 10 such that it serves as the object point of the objective lens 17. When the aberration corrector 10 is in the ON mode, the total magnification of the spot before the crossover 44 should be smaller than when the aberration corrector 10 is in the OFF mode. Otherwise, the resolution is not improved since the diameter of a convergence spot 45 is originally large, even if the axial adjustment of the aberration corrector 10 is performed successfully.

In such an application of the aberration corrector 10, the pair of multipole lenses 11 and 14 and the pair of electromagnetic multipole lenses 12 and 13 are excited with excellent symmetry so that the spherical aberration inherent in the aberration corrector 10 is reduced compared with the case of the first embodiment. This offers the advantage that the intensities of the octupole fields for correcting the spherical aberration can be reduced.

According to the present invention, image forming conditions for the objective lens can be held constant irrespective of the ON/OFF modes of the aberration corrector, which allows easy recognition of the effect of aberration correction and an easy adjusting operation for the aberration corrector. The procedures for adjusting the entire apparatus can be reduced and an electron beam apparatus with an aberration corrector which is high in operability can be provided.

What is claimed is:

1. An electron beam apparatus with an aberration corrector, said apparatus comprising:
    an electron optical system which has at least an electron gun for emitting an electron beam, a condenser lens, an objective lens for converging an electron beam onto a surface of a specimen, and a scanning deflector for causing the converged electron beam to scan the surface of the specimen;
    said aberration corrector composed of a plurality of combined multipole lenses; and
    a computer for controlling at least one of the electron optical system and said aberration corrector, said computer having a first scan mode for enabling operation of said aberration corrector and a second scan mode for disabling the operation of said aberration corrector and controlling said objective lens, said condenser lens, or said aberration corrector such that an object point of the objective lens does not substantially change in either of the modes.

2. An electron beam apparatus with an aberration corrector, said apparatus comprising:
    an electron optical system which has at least an electron gun for emitting an electron beam, a condenser lens, an objective lens for converging an electron beam onto a surface of a specimen, and a scanning deflector for causing the converged electron beam to scan the surface of the specimen;
    said aberration corrector composed of a plurality of combined multipole lenses; and
    a computer for controlling at least one of the electron optical system and said aberration corrector, said computer having a first scan mode for enabling operation of said aberration corrector and a second scan mode for disabling the operation of said aberration corrector and controlling said objective lens, said condenser lens, or said aberration corrector such that an object point of the objective lens does not substantially change in either of the modes by switching a magnetization intensity of said condenser lens in association with ON/OFF modes of the aberration corrector.

3. An electron beam apparatus with an aberration corrector according to claim 1, wherein in said second scan mode, operation of said multipole lenses is disabled.

4. An electron beam apparatus with an aberration corrector according to claim 2, wherein in said second scan mode, operation of said multipole lenses is disabled.

5. An electron beam apparatus comprising:
   an electron optical system which has at least an electron gun for emitting an electron beam, a condenser lens, an objective lens, and a scanning coil;
   an aberration corrector composed of a plurality of combined multipole lenses; and
   a computer controlling at least one of the electron optical system and the aberration corrector,
   wherein said computer has a ON mode for enabling operation of said multipole lenses and a OFF mode for disabling the operation of said multipole lenses and controlling at least one of the electron optical system and the aberration corrector such that an object point of the objective lens does not substantially change in either of the modes.

6. An electron beam apparatus according to claim 5, wherein said computer controls said objective lens, said condenser lens, or said aberration corrector such that said object point of the objective lens does not substantially change in either of the modes.

7. An electron beam apparatus according to claim 5, further comprising a mechanism for detecting a secondary electron and a reflected electron and forming an image in said ON mode for enabling operation of said multipole lenses and in said OFF mode for disabling the operation of said multipole lenses.

8. An electron beam apparatus according to claim 5, wherein said computer controls at least one of said electron optical system and said aberration corrector based on an image which detects secondary electrons or reflected electrons in said ON mode for enabling operation of said multipole lenses and in said OFF mode for disabling the operation of said multipole lenses.

* * * * *